United States Patent
Lin et al.

(10) Patent No.: US 7,218,176 B2
(45) Date of Patent: May 15, 2007

(54) DIGITAL PHASE-LOCKED LOOP CIRCUIT

(75) Inventors: Chun-Wei Lin, Kao-Hsiung (TW); Hsueh-Kun Liao, Yun-Lin Hsien (TW); Chih-Ching Chen, Chia-Yi Hsien (TW)

(73) Assignee: Mediatek Inc., Hsinchu (TW)

( * ) Notice: Subject to any disclaimer, the term of this patent is extended or adjusted under 35 U.S.C. 154(b) by 0 days.

(21) Appl. No.: 10/935,863

(22) Filed: Sep. 8, 2004

(65) Prior Publication Data
US 2005/0062549 A1 Mar. 24, 2005

(30) Foreign Application Priority Data
Sep. 18, 2003 (TW) ............... 92125806 A

(51) Int. Cl.
*H03L 7/00* (2006.01)
(52) U.S. Cl. .................... 331/16; 331/1 A; 331/34; 331/17
(58) Field of Classification Search ............... 331/1 A, 331/17, 16, 34, 25
See application file for complete search history.

(56) References Cited

U.S. PATENT DOCUMENTS 6,731,101 B2 * 5/2004 Miyagawa et al. ...... 324/76.79
6,809,599 B2 * 10/2004 Shimoda ..................... 331/17
2005/0052208 A1 * 3/2005 Starr ......................... 327/156

FOREIGN PATENT DOCUMENTS

CN 1205577 1/1999

OTHER PUBLICATIONS

China Office Action issued Jul. 7, 2006.

* cited by examiner

*Primary Examiner*—Arnold Kinkead
(74) *Attorney, Agent, or Firm*—Thomas, Kayden, Horstemeyer & Risley

(57) ABSTRACT

A digital phase-locked loop circuit includes a counter for outputting a count value corresponding to an output frequency outputted by a voltage controlled oscillator in response to a control voltage signal, a comparator for comparing the count value from the counter with a target value associated with a target frequency output and for outputting a comparison signal according to a comparison result therebetween, a digital reference value generator for outputting a digital reference value according to the comparison signal from the comparator and including a register for storing the digital reference value therein, and a digital-to-analog converter for generating the control voltage signal based on the digital reference value received from the digital reference value generator.

7 Claims, 2 Drawing Sheets

DIGITAL PHASE-LOCKED LOOP CIRCUIT

CROSS-REFERENCE TO RELATED APPLICATION

This application claims priority of Taiwanese Application No. 092125806, filed on Sep. 18, 2003.

BACKGROUND OF THE INVENTION

1. Field of the Invention

The invention relates to a digital phase-locked loop circuit, more particularly to a digital phase-locked loop circuit that requires a relatively small circuit layout.

2. Description of the Related Art

Equalizers are usually built in control chips for optical disk drives suitable for CD-ROM, CD-R, CD-RW and DVD-ROM applications, and serve to amplitude equalize radio frequency signals generated by an optical pickup heads when reading an optical disk. Therefore, it is important to stabilize a −3 dB frequency ($f_E$) of an equalizer filter so as not to affect post-processing by a digital signal processor.

FIG. 1 illustrates a control loop composed of a conventional phase-locked loop circuit 1 and a voltage controlled oscillator 2 for adequately adjusting a control voltage signal (vin) inputted to an equalizer filter 6 so as to stabilize a −3 dB frequency ($f_E$) of the equalizer filter 6. The conventional phase-locked loop circuit 1 serves to generate the control voltage signal (vin) that is used to enable the voltage controlled oscillator 2 to generate a target frequency output ($f_B$). The conventional phase-locked loop circuit 1 includes a frequency divider 11 for frequency dividing an output frequency ($f_o$) outputted by the voltage controlled oscillator 2 in response to the control voltage signal (vin), a phase comparator 12 for phase comparing the output the frequency divider 11 with the target frequency output ($f_B$) and for outputting an error signal (Te) according to a phase difference therebetween, a charge pump 13 driven in response to the error signal (Te) and outputting a current output Io, and a low-pass filter 14, which includes a resistor ($R_0$) and a capacitor ($C_0$), for integrating the current output from the charge pump 13 and for outputting the control voltage signal (vin).

It is assumed that the −3 dB frequency ($f_E$) of the equalizer filter 6 is represented by the following equation: $f_E = k1 \times vin$, where k1 is a constant associated with electrical characteristics of electronic components in the equalizer filter 6 and changes with actual operating temperature conditions, and that the target frequency output ($f_B$) is represented by the following equation: $f_B = k2 \times vin$, where k2 is a constant associated with electrical characteristics of electronic components in the control loop and also changes with actual operating temperature conditions. Since a ratio of k1 and k2 almost does not change even at different operating temperature conditions, the control voltage signal (vin) generated by the conventional phase-locked loop circuit 1 can stabilize the −3 dB frequency ($f_E$) of the equalizer filter 6.

However, in view of the above configuration, the frequency divider 11, the phase comparator 12 and the charge pump 13 require a relatively large layout area (about 280000 µm²) for fabrication.

SUMMARY OF THE INVENTION

Therefore, the object of the present invention is to provide a digital phase-locked loop circuit that requires a relatively small layout area.

According to the present invention, there is provided a digital phase-locked loop circuit for generating a control voltage signal that is used to enable a voltage controlled oscillator to generate a target frequency output. The digital phase-locked loop circuit comprises:

a counter for outputting a count value corresponding to an output frequency outputted by the voltage controlled oscillator in response to the control voltage signal;

a comparator coupled to the counter and receiving the count value therefrom, the comparator comparing the count value with a target value associated with the target frequency output and outputting a comparison signal according to a comparison result therebetween;

a digital reference value generator coupled to the comparator and receiving the comparison signal therefrom, the digital reference value generator outputting a digital reference value according to the comparison signal, and including a register for storing the digital reference value therein; and a digital-to-analog converter coupled to the digital reference value generator and receiving the digital reference value therefrom, the digital-to-analog converter generating the control voltage signal from the digital reference value.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
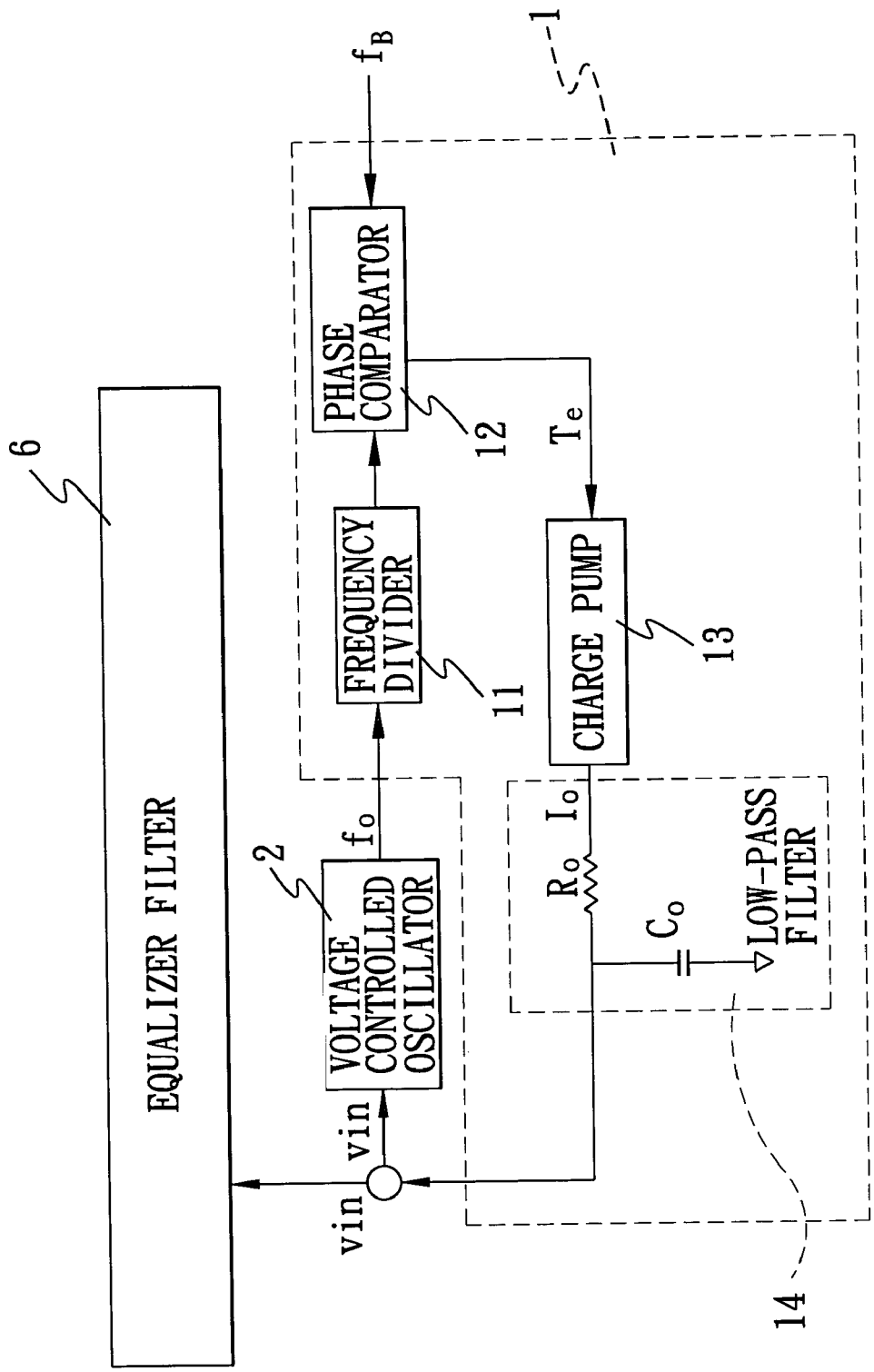
FIG. 1 is a schematic circuit block diagram showing a conventional phase-locked loop circuit.
Figure 2:
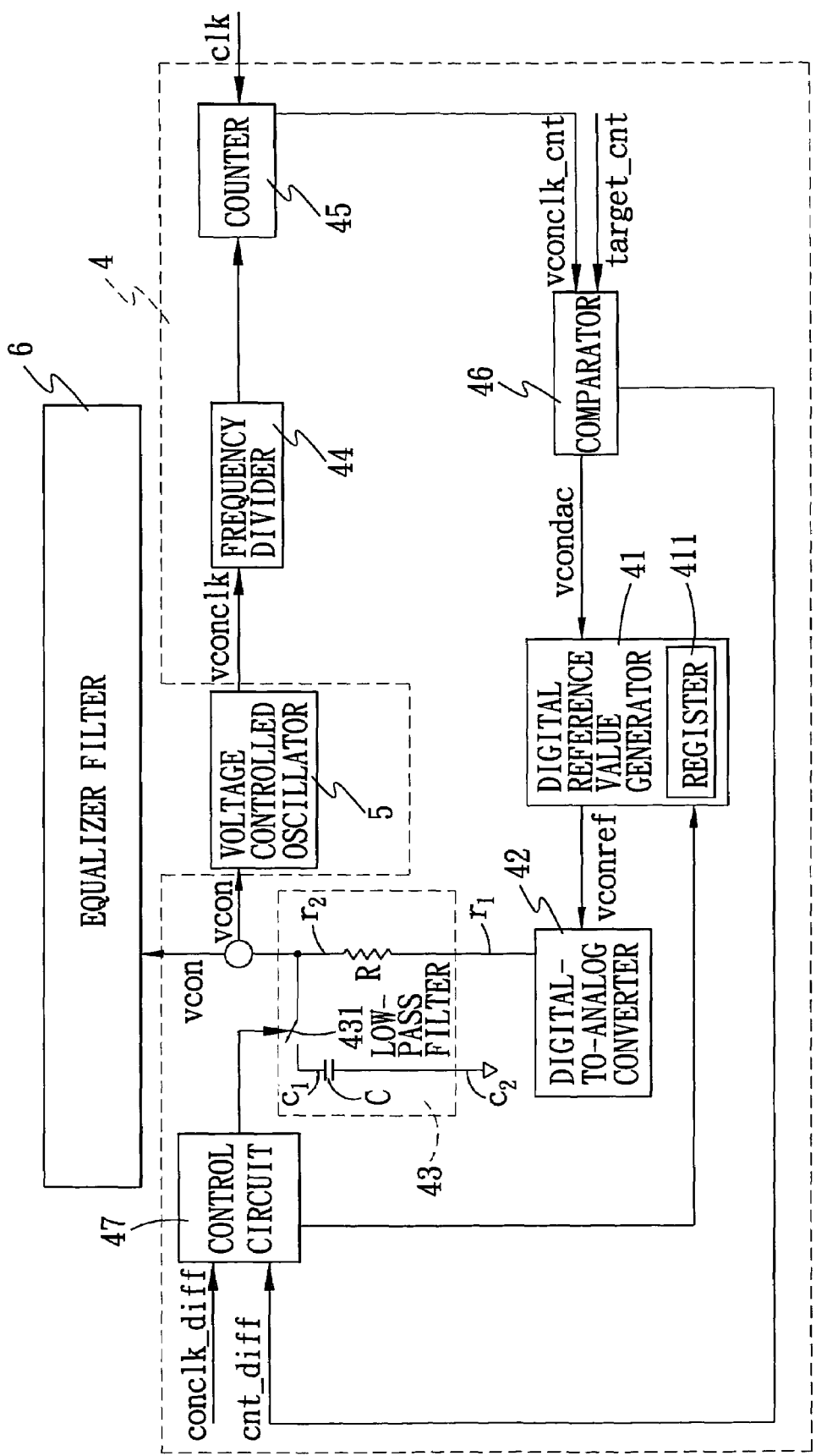
FIG. 2 is a schematic circuit block diagram showing the preferred embodiment of a digital phase-locked loop circuit according to this invention.

FIG. 2 illustrates the preferred embodiment of a digital phase-locked loop circuit 4 for generating a control voltage signal (vcon) that is used to enable a voltage controlled oscillator 5 to generate a target frequency output ($f_B$) according to the present invention. The relationship between the −3 dB frequency output ($f_E$) of an equalizer filter 6, and the target frequency output ($f_B$) can be represented by the following equations:

$$f_E = k1 \times vcon$$

$$f_B = k2 \times vcon$$

where k1 is a constant associated with electrical characteristics of electronic components in the equalizer filter 6, and k2 is a constant associated with electrical characteristics of electronic components in a loop composed of the voltage controlled oscillator and the digital phase-locked loop circuit 4. Both k1 and k2 change with actual operating temperature conditions. However, a ratio of k1 and k2 almost does not change even at different operating temperature conditions. Therefore, the control voltage signal (vcon) can also be used to stabilize the −3 dB frequency output ($f_E$) of the equalizer filter 6.

The digital phase-locked loop circuit 4 includes a frequency divider 44, a counter 45, a comparator 46, a digital reference value generator 41, a digital-to-analog converter 42, a low-pass filter 43, and a control circuit 47.

The frequency divider 44 is adapted to be coupled to the voltage controlled oscillator 5 and is adapted for frequency dividing an output frequency (vconclk) outputted by the voltage controlled oscillator 5 in response to the control voltage signal (vcon).

The counter 45 is coupled to the frequency divider 44, and receives a divided output frequency therefrom. The counter 45 outputs a count value (vconclk_cnt) from the divided output frequency corresponding to the output frequency (vconclk) at a constant clock frequency.

The comparator 46 is coupled to the counter 45, and receives the count value (vconclk_cnt) therefrom. The comparator 46 compares the count value (vconclk_cnt) with a target value (target_cnt) associated with the target frequency output ($f_E$), and outputs a comparison signal (vcondac) according to a comparison result therebetween. In this embodiment, the comparator 46 further outputs a measured difference value (cnt_diff) that is a difference between the target value (target_cnt) and the count value (vconclk_cnt).

The digital reference value generator 41 is coupled to the comparator 46, and receives the comparison signal (vcondac) therefrom. The digital reference value generator 41 outputs a digital reference value (vconref) according to the comparison signal (vcondac), and includes a register 411 for storing the digital reference value (vconref) therein. In this embodiment, the digital reference value (vconref) in the register 411 is updated in increments when the count value (vconclk_cnt) is less than the target value (target_cnt), and in decrements when the count value (vconclk_cnt) is greater than the target value (target_cnt). The updating procedure of the digital reference value (vconref) will be described in greater detail in the succeeding paragraphs The digital-to-analog converter 42 is coupled to the digital reference value generator 41, and receives the digital reference value (vconref) therefrom. The digital-to-analog converter 42 generates the control voltage signal (vcon) from the digital reference value (vconref) in a conventional manner.

The low-pass filter 43 is coupled to the digital-to-analog converter 42 for processing the control voltage signal (vcon) therefrom. In this embodiment, the low-pass filter 43 includes a resistor (R) that has one end (r1) coupled to the digital-to-analog converter 42, and the other end (r2) adapted to be coupled to the voltage controlled oscillator 5 and the equalizer filter 6 for outputting the control voltage signal (vcon) thereto, a capacitor (C) that has a first end (c1) and a second grounded end (c2), and a control switch 431 coupled between the first end (c1) of the capacitor (C) and the other end (r2) of the resistor (R).

The control circuit 47 is coupled to the comparator 46 and the control switch 431 of the low-pass filter 43. The control circuit 47 receives the measured difference value (cnt_diff) from the comparator 46, compares the measured difference value (cnt_diff) with a standard difference value (conclk_diff), and selectively enables and disables the low-pass filter 43 according to a comparison result between the measured difference value (cnt_diff) and the standard difference value (conclk_diff.). In this embodiment, since the low-pass filter 43 has a longer response time in an enabled mode than that in a disabled mode, the control circuit 47 enables the low-pass filter 43 (i.e., the control switch 431 is turned on by the control circuit 47) when the measured difference value (cnt_diff) is less than the standard difference value (conclk_diff), and disable the low-pass filter 43 (i.e., the control switch 431 is turned off by the control circuit 47) when the measured difference value (cnt_diff) is greater than the standard difference value (conclk_diff) so that the count value (vconclk_cnt) can be kept close to the target value (target_cnt) as fast as possible.

The control circuit 47 is further coupled to the digital reference value generator 41, and enables the digital reference value generator 41 to update the digital reference value (vconref) in the register 411 at one of a lower update frequency and a higher update frequency according to the comparison result between the measured difference value (cnt_diff) and the standard difference value (conclk_diff). In this embodiment, the digital reference value (vconref) in the register 411 is updated at the lower update frequency when the measured difference value (cnt_diff) is less than the standard difference value (conclk_diff), and at the higher update frequency when the measured difference value (cnt_diff) is greater than the standard difference value (conclk_diff). Preferably, the lower update frequency cannot be greater than a −3 dB frequency band of the low-pass filter 43.

In view of the above configuration, the present invention which includes the counter 45, the comparator 46, the digital reference value generator 41, the digital-to-analog converter 42, etc., can be fabricated in a circuit layout having a layout area of about 16320 $\mu m^2$ which is much less than that of the aforesaid conventional phase-locked loop circuit (about 280000 $\mu m^2$). Moreover, the capacitor (C) of the low-pass filter 43 has a capacitance smaller than that of the aforesaid conventional phase-locked loop circuit. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A digital phase-locked loop circuit for generating a control voltage signal that is used to enable a voltage controlled oscillator to generate a target frequency output, said digital phase-locked loop circuit comprising:
   a counter for outputting a count value corresponding to an output frequency outputted by the voltage controlled oscillator in response to the control voltage signal;
   a comparator coupled to said counter and receiving the count value therefrom, said comparator comparing the count value with a target value associated with the target frequency output and outputting a comparison signal according to a comparison result therebetween;
   a digital reference value generator coupled to said comparator and receiving the comparison signal therefrom, said digital reference value generator outputting a digital reference value according to the comparison signal, and including a register for storing the digital reference value therein;
   a digital-to-analog converter coupled to said digital reference value generator and receiving the digital reference value therefrom, said digital-to-analog converter generating the control voltage signal from the digital reference value;
   a low-pass filter coupled to said digital-to-analog converter for processing the control voltage signal therefrom; and
   wherein said comparator further outputs a measured difference value that is a difference between the target value and the count value, said digital phase-locked loop circuit further comprising a control circuit coupled to said comparator and said low-pass filter, said control circuit receiving the measured difference value from said comparator, comparing the measured difference value with a standard difference value, and selectively enabling and disabling said low-pass filter according to a comparison result between the measured difference value and the standard difference value.

2. The digital phase-locked loop circuit as claimed in claim 1, further comprising a frequency divider coupled to said counter and adapted for frequency dividing the output frequency from the voltage controlled oscillator so as to enable said counter to output the count value.

3. The digital phase-locked loop circuit as claimed in claim 1, wherein said control circuit enables said low-pass filter when the measured difference value is less than the standard difference value, and disables said low-pass filter when the measured difference value is greater than the standard difference value.

4. The digital phase-locked loop circuit as claimed in claim 1, wherein said control circuit is further coupled to said digital reference value generator and enables said digital reference value generator to update the digital reference value in said register at one of a lower update frequency and a higher update frequency according to the comparison result between the measured difference value and the standard difference value.

5. The digital phase-locked loop circuit as claimed in claim 4, wherein the digital reference value in said register is updated at the lower update frequency when the measured difference value is less than the standard difference value, and at the higher update frequency when the measured difference value is greater than the standard difference value.

6. The digital phase-locked loop circuit as claimed in claim 4, wherein the digital reference value in said register is updated in increments when the count value is less than the target value, and in decrements when the count value is greater than the target value.

7. The digital phase-locked loop circuit as claimed in claim 1, wherein said low-pass filter includes a resistor that has one end coupled to said digital-to-analog converter, a capacitor that has a first end and a second grounded end, and a control switch coupled between said first end of said capacitor and the other end of said resistor, said control switch being coupled to and controlled by said control circuit to selectively enable and disable said low-pass filter.

* * * * *